US008659329B2

(12) United States Patent
Moon et al.

(10) Patent No.: US 8,659,329 B2
(45) Date of Patent: Feb. 25, 2014

(54) PRE-EMPHASIS CIRCUIT AND DIFFERENTIAL CURRENT SIGNALING SYSTEM HAVING THE SAME

(75) Inventors: Yong Hwan Moon, Incheon-si (KR); Jun Ho Kim, Goyang-si (KR); Jae Ryun Shim, Daejeon-si (KR); Chul Soo Jeong, Daejeon-si (KR); Sang Ho Kim, Gunpo-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 26 days.

(21) Appl. No.: 13/357,224

(22) Filed: Jan. 24, 2012

(65) Prior Publication Data
US 2012/0194224 A1 Aug. 2, 2012

(30) Foreign Application Priority Data
Jan. 28, 2011 (KR) .................. 10-2011-0008629

(51) Int. Cl.
*H03B 1/00* (2006.01)
*H03K 3/00* (2006.01)
(52) U.S. Cl.
USPC .............. 327/109; 327/108; 327/110; 326/86

(58) Field of Classification Search
USPC .............................. 327/108, 109, 110; 326/86
See application file for complete search history.

(56) References Cited

U.S. PATENT DOCUMENTS 7,183,813 B2 * 2/2007 Kasanyal et al. ............... 327/65
7,863,936 B1 * 1/2011 Liu et al. ......................... 326/86

* cited by examiner

*Primary Examiner* — John Poos
(74) *Attorney, Agent, or Firm* — Kile Park Reed & Houtteman PLLC

(57) ABSTRACT

Provided is a pre-emphasis circuit which transmits a pre-emphasis output current to an output node of an output driver in response to first to fourth pre-emphasis control signals generated by a logical operation on differential input signals. The pre-emphasis circuit includes: a first pre-emphasis circuit driven in a range between a first voltage and a second voltage and configured to generate a first pre-emphasis output current in response to the first and second pre-emphasis control signals and output the generated first pre-emphasis output current to a first output node of the output driver; and a second pre-emphasis circuit driven in the range between the first voltage and the second voltage and configured to generate a second pre-emphasis output current in response to the third and fourth pre-emphasis control signals and output the generated second pre-emphasis output current to a second output node of the output driver.

11 Claims, 8 Drawing Sheets

PRE-EMPHASIS CIRCUIT AND DIFFERENTIAL CURRENT SIGNALING SYSTEM HAVING THE SAME

BACKGROUND OF THE INVENTION

1. Field of the Invention

The present invention relates to a pre-emphasis circuit used in a signaling system.

2. Description of the Related Art

Conventionally, research has been conducted on a signaling system based on a differential current driving method, which transmits differential current signals through a differential transmission line pair such that a receiver detects the transmitted signals.

In the differential current driving method, a transmitter generates currents having different magnitudes, corresponding to data which are to be transmitted, and transmits the generated currents through two transmission lines, and a receiver restores the data using a difference between the currents flowing through the two transmission lines.

In the signaling system based on the differential current driving method, when the transmitter transmits a digital signal through a channel with a loss, the transmitted signal is received by the receiver in a state where the signal is distorted according to a frequency characteristic of the channel. In general, since a channel with a loss has a larger loss in a high-frequency region, a high-frequency component of a signal transmitted through the channel is further attenuated than a low-frequency component. In a digital signal, a high-frequency component corresponds to where the voltage level of the signal rapidly changes, that is, a rising edge or falling edge.

Therefore, a signal passing through the channel with a loss has a more distorted waveform than an original waveform, and the arrival time of the transmitted signal may differ for each frequency. As a result, jitter may occur, and a timing margin may be significantly reduced as a whole.

In order to solve such a problem, a pre-emphasis method is used as a method which emphasizes or suppresses a signal for each frequency band to compensate for a signal which is distorted while the signal passes through the channel, and controls the waveform of the signal such that the receiver may receive the original signal.

In the pre-emphasis method, the transmitter previously reinforces a high-frequency band of a signal by a predetermined amount before transmitting the signal, and transmits the reinforced signal. As described above, a high frequency component of a signal emerges at a rising edge or falling edge. The pre-emphasis method is to increase the magnitude of the signal at an edge by an amount distorted through the channel.

FIG. 1 illustrates a conventional pre-emphasis circuit formed in an output driver based on the differential signal driving method.

Referring to FIG. 1, the conventional pre-emphasis circuit includes a first pre-emphasis circuit 110 and a second pre-emphasis circuit 130.

The first pre-emphasis circuit 110 includes four switching transistors 111 to 114 operating in the range between a first voltage VDD and a second voltage GND. Among the four switching transistors 111 to 114, the two switching transistors 111 and 112 are PMOS transistors and operate as a two-stage source to transmit the first voltage VDD to the output driver 120, and the two switching transistors 113 and 114 are NMOS transistors and operate as a two-stage sink to suppress an output voltage of the output driver 120.

The second pre-emphasis circuit 130 includes four switching transistors 131 to 134 operating in a range between the first voltage VDD and the second voltage GND. Among the four switching transistors 131 to 134, the two switching transistors 131 and 132 are PMOS transistors and operate as a two-stage source to transmit the first voltage VDD to the output driver 120, and the two switching transistors 133 and 134 are NMOS transistors and operate as a two-stage sink to suppress an output voltage of the output driver 120.

In order for an effective operation, the pre-emphasis circuit should operate only as a source when operating as a source, and operate only as a sink when operating as a sink.

However, the pre-emphasis circuit illustrated in FIG. 1 controls four transistors using two input signals IN1 and IN2. Therefore, during a source operation or sink operation, an undesired current may be passed to reduce the pre-emphasis effect.

FIGS. 2A and 2B show currents flowing in the switching transistors of the conventional pre-emphasis circuit.

FIG. 2A shows a current flowing in the switching transistor 112 operating as a source, and FIG. 2B shows a current flowing in the switching transistor 113 operating as a sink.

Referring to FIGS. 2A and 2B, it can be seen that the source current and the sink current simultaneously flow in the switching transistor 112 operating as a source and the switching transistor 113 operating as a sink in the conventional pre-emphasis circuit.

Since the conventional pre-emphasis circuit controls four transistors using two input signals IN1 and IN2, the circuit cannot control the source and the sink separately. Therefore, the sink current may flow in the transistors operating as the source, and the source current may flow in the transistors operating as the sink, thereby reducing the pre-emphasis effect.

Furthermore, as the conventional pre-emphasis circuit uses four transistors, a load value is increased by parasitic resistance and parasitic capacitance values depending on the transistors. Thus, the switching speed decreases.

In the conventional pre-emphasis circuit, since a supply time of a pre-emphasis current is decided according to a predetermined delay time, too much pre-emphasis or too little pre-emphasis may be applied according to a load value of a transmission line. Therefore, it is difficult to actively control and supply a pre-emphasis current.

SUMMARY OF THE INVENTION

Accordingly, the present invention has been made in an effort to solve the problems occurring in the related art, and an object of the present invention is to provide a pre-emphasis circuit and a differential current signaling system, which are capable of reducing parasitic resistance and parasitic capacitance by decreasing the number of switching transistors required for operating the pre-emphasis circuit and substantially preventing an undesired current by supplying pre-emphasis control signals for controlling the respective switching transistors.

In order to achieve the above object, according to one aspect of the present invention, there is provided a pre-emphasis circuit which transmits a pre-emphasis output current to an output node of an output driver in response to first to fourth pre-emphasis control signals generated by a logical operation on differential input signals. The pre-emphasis circuit includes: a first pre-emphasis circuit driven in a range between a first voltage and a second voltage and configured to generate a first pre-emphasis output current in response to the first and second pre-emphasis control signals and output the generated first pre-emphasis output current to a first output node of the output driver; and a second pre-emphasis circuit driven in the range between the first voltage and the second voltage and configured to generate a second pre-emphasis output current in response to the third and fourth pre-emphasis control signals and output the generated second pre-emphasis output current to a second output node of the output driver.

According to another aspect of the present invention, there is provided a differential current signaling system including: a pre-emphasis control signal generation unit configured to receive differential input signals and generate delayed differential input signals and pre-emphasis control signals; an output driver configured to generate output signals in response to the delayed differential input signals and output the generated output signals to output nodes; and a pre-emphasis circuit configured to generate a pre-emphasis output current in response to the pre-emphasis control signals and output the generated pre-emphasis output current to the output nodes.

According to another aspect of the present invention, a differential current signaling system includes: a pre-emphasis control signal generation unit configured to receive differential input signals and differential control signals and generate delayed differential input signals and pre-emphasis control signals; an output driver configured to generate output signals in response to the delayed differential input signals and output the generated output signals to an output node; a pre-emphasis circuit configured to generate a pre-emphasis output current in response to the pre-emphasis control signals and output the generated pre-emphasis output current to the output node; a dummy unit configured to generate and output a reference voltage which is a high voltage; and a comparison unit configured to compare the output signals with the reference voltage, generate the differential control signals, and provide the generated differential control signals to the pre-emphasis control signal generation unit.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
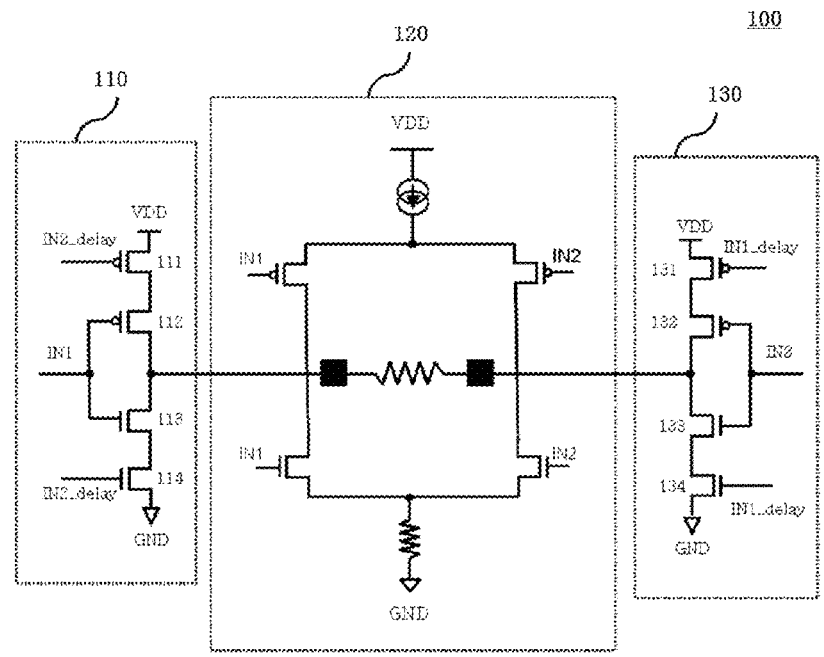
FIG. 1 illustrates a conventional pre-emphasis circuit formed in an output driver based on a differential signal driving method.
Figure 2:
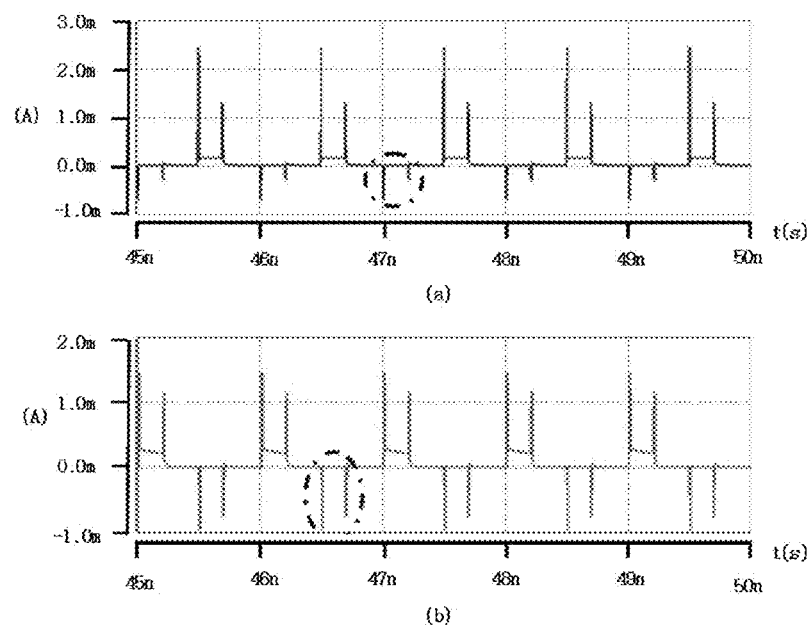
FIGS. 2A and 2B show currents flowing in switching transistors of the conventional pre-emphasis circuit.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
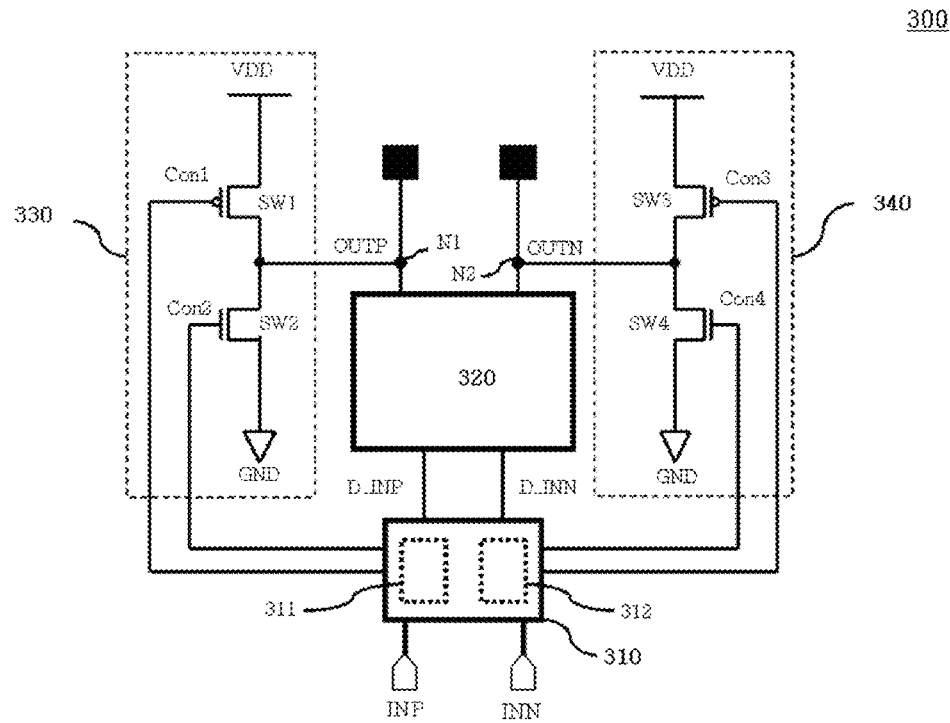
FIG. 3 illustrates the configuration of a differential current signaling system including a pre-emphasis circuit according to an embodiment of the present invention.

FIG. 3 illustrates the configuration of a differential current signaling system including a pre-emphasis circuit according to an embodiment of the present invention.

Referring to FIG. 3, the differential current signaling system according to the embodiment of the present invention includes a pre-emphasis control signal generation unit 310, an output driver 320, and a pre-emphasis circuit 330 and 340.

The pre-emphasis control signal generation unit 310 includes a delay circuit 311 and a control signal generation circuit 312. The delay circuit 311 is configured to receive differential input signals INP and INN and generate delayed differential input signals D_INP and D_INN. The control signal generation circuit 312 is configured to perform a logical operation on the differential input signals INP and INN and generate pre-emphasis control signals Con1 to Con4.

The output driver 320 is configured to generate output signals OUTP and OUTN in response to the delayed differential input signals D_INP and D_INN and output the generated signals to output nodes N1 and N2, respectively.

The pre-emphasis circuit 330 and 340 includes a first pre-emphasis circuit 330 and a second pre-emphasis circuit 340, and is configured to generate pre-emphasis output currents in response to the pre-emphasis control signals con1 to con4 generated by the pre-emphasis control signal generation unit 310 and output the generated pre-emphasis output currents to the output node N1 and N2.

The first pre-emphasis circuit 330 is driven in a range between a first voltage VDD and a second voltage GND and configured to generate a first pre-emphasis output current in response to the first and second pre-emphasis control signals Con1 and Con2, and output the generated first pre-emphasis output current to the first node N1. The first pre-emphasis circuit 330 includes a first switch SW1 and a second switch SW2. The first switch SW1 has a first terminal coupled to the first voltage VDD, a second terminal coupled to the first output node N1, and a control terminal configured to receive the first pre-emphasis control signal Con1. The second switch SW2 has a first terminal coupled to the first output node N1, a second terminal coupled to the second voltage GND, and a control terminal configured to receive the second pre-emphasis control signal Con2.

The second pre-emphasis circuit 340 is driven in the range between the first voltage VDD and the second voltage GND and configured to generate a second pre-emphasis output current in response to the third and fourth pre-emphasis control signals Con3 and Con4, and output the generated second pre-emphasis output current to the second node N2. The second pre-emphasis circuit 340 includes a third switch SW3 and a fourth switch SW4. The third switch SW3 has a first terminal coupled to the first voltage VDD, a second terminal coupled to the second output node N2, and a control terminal configured to receive the third pre-emphasis control signal Con3. The fourth switch SW4 has a first terminal coupled to the second output node N2, a second terminal coupled to the second voltage GND, and a control terminal configured to receive the fourth pre-emphasis control signal Con4.

The first and fourth switches SW1 and SW4 and the second and third switches SW2 and SW3 operate complementarily with each other. That is, when the first and fourth switches SW1 and SW4 are turned on, the second and third switches SW2 and SW3 are turned off. When the first and fourth switches SW1 and SW4 are turned off, the second and third switches SW2 and SW3 are turned on. The first to fourth switches SW1 to SW4 may be implemented with MOS transistors, but are not limited thereto.

Figure 4:
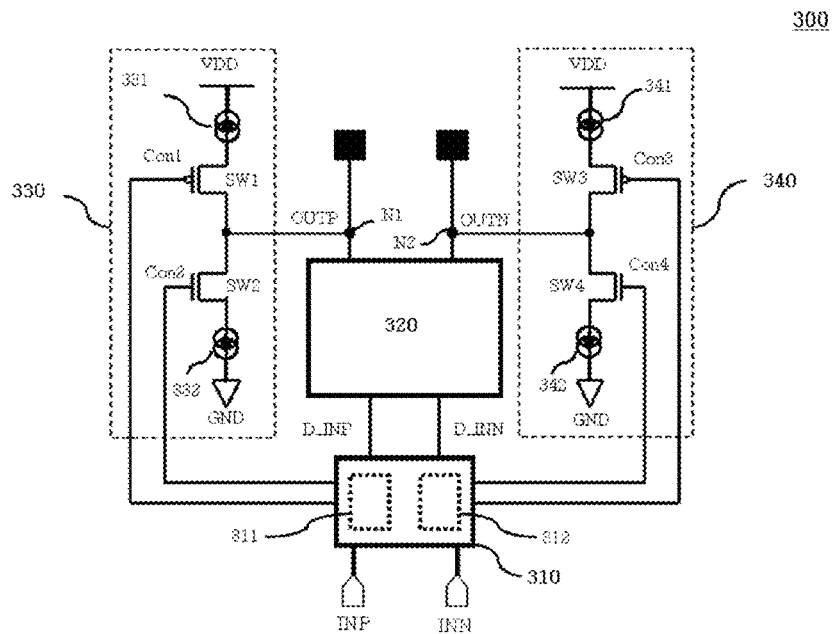
FIG. 4 illustrates the configuration of a pre-emphasis circuit and a differential current signaling system having the same according to another embodiment of the present invention.

FIG. 4 illustrates the configuration of a pre-emphasis circuit and a differential current signaling system having the same according to another embodiment of the present invention.

Referring to FIG. 4, the pre-emphasis circuit 330 and 340 includes constant current sources 331, 332, 341, and 342 coupled between terminals of first to fourth switches SW1 to SW4 and a first or second voltage VDD or GND, in order to supply a constant current.

That is, the pre-emphasis circuit according to the embodiment of the present invention may further include the first to fourth current sources 331, 332, 341, and 342, in addition to the components of the pre-emphasis circuit of FIG. 3. The first current source 331 is formed between a first terminal of the first switch SW1 and the first voltage VDD, and the second current source 332 is formed between a second terminal of the second switch SW2 and the second voltage GND. The third current source 341 is formed between a first terminal of the third switch SW3 and the first voltage VDD, and the fourth current source 342 is formed between a second terminal of the fourth switch SW4 and the second voltage GND. The first to fourth switches SW1 to SW4 may be implemented with MOS transistors.

Other components such as the control signal generator 310, the output driver 320, the first pre-emphasis circuit 330, and the second pre-emphasis circuit 340 may be easily understood by those skilled in the art from the descriptions of FIG. 3. Thus, the detailed descriptions thereof are omitted.

Figure 5:
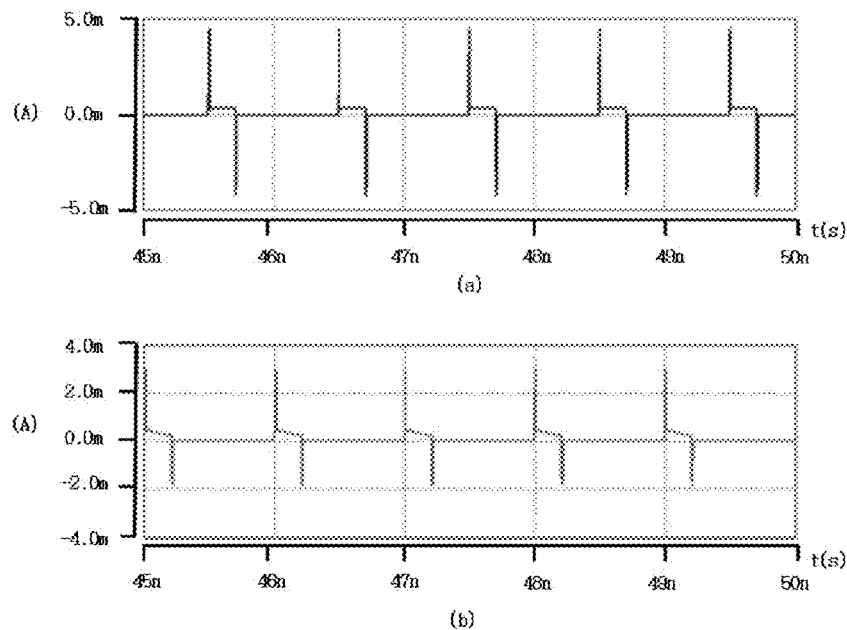
FIGS. 5A and 5B are diagrams showing currents flowing in switches of the pre-emphasis circuit according to the embodiment of the present invention.

FIGS. 5A and 5B are diagrams showing currents flowing in the switches of the pre-emphasis circuit according to the embodiment of the present invention.

FIG. 5A shows a current flowing in the first switch SW1 operating as a source, and FIG. 5B shows a current flowing in the second switch SW2 operating as a sink.

In the pre-emphasis circuit according to the embodiment of the present invention, each of the first and second switches SW1 and SW2 is operated by one control signal. Therefore, referring to FIG. 5, it can be seen that when one switch operates as a source or sink, an unnecessary current does not flow in the other switch.

Figure 6:
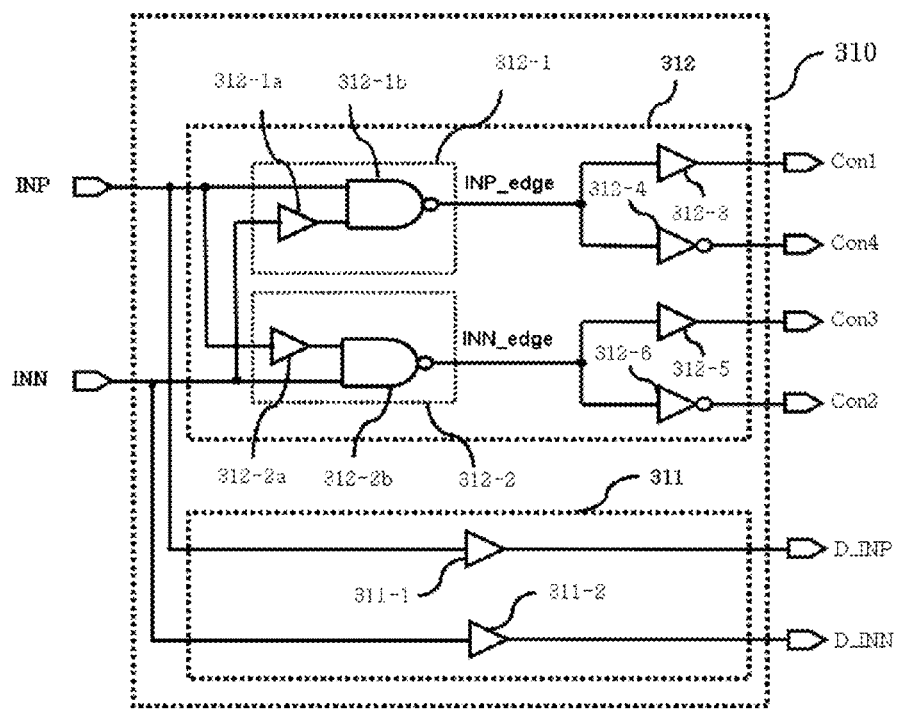
FIG. 6 illustrates the configuration of a pre-emphasis control signal generation unit of the differential current signaling system according to the embodiment of the present invention.

FIG. 6 illustrates the configuration of the pre-emphasis control signal generation unit of the differential current signaling system according to the embodiment of the present invention.

Referring to FIG. 6, the pre-emphasis control signal generation unit 310 according to the embodiment of the present invention includes a delay circuit 311 and a control signal generation circuit 312.

The delay circuit 311 includes first and second buffers 311-1 and 311-2 configured to receive differential input signals INP and INN and generate delayed differential input signal D_INP and D_INN.

The control signal generation circuit 312 is configured to receive the differential input signals INP and INN and generate pre-emphasis control signals Con1 to Con4, and includes a first logic circuit section 312-1, a second logic circuit section 312-2, a third buffer 312-3, a first inverter 312-4, a fourth buffer 312-5, and a second inverter 312-6.

The first logic circuit section 312-1 includes a fifth buffer 312-1a and a first NAND gate 312-1b. The fifth buffer 312-1a has a first terminal coupled to the second differential input signal INN. The first NAND gate 312-1b has a first input terminal configured to receive the first differential input signal INP and a second input terminal configured to receive an output signal of the fifth buffer 312-1a and is configured to perform a NAND operation on the received signals and output a first differential edge signal INP_edge. That is, the first logic circuit section 312-1 receives the first and second differential input signals INP and INN and generates the first differential edge signal INP_edge.

The second logic circuit section 312-2 includes a sixth buffer 312-2a and a second NAND gate 312-2b. The sixth buffer 312-2a has a first terminal coupled to the first differential input signal INP. The second NAND gate 312-2b has a first input terminal configured to receive the second differential input signal INN and a second input terminal configured to receive an output signal of the sixth buffer 312-2a and is configured to perform a NAND operation on the received signals and output a second differential edge signal INN_edge. That is, the first logic circuit section 312-2 receives the first and second differential input signals INP and INN and generates the second differential edge signal INN_edge.

The third buffer 312-3 is configured to receive the first differential edge signal INP_edge and delay the first differential edge signal INP_edge to output as the first pre-emphasis control signal Con1, and the first inverter 312-4 is configured to receive the first differential edge signal INP_edge and invert and delay the first differential edge signal INP_edge to output as the fourth pre-emphasis control signal Con4.

The fourth buffer 312-5 is configured to receive the second differential edge signal INN_edge and delay the second differential edge signal INN_edge to output as the third pre-emphasis control signal Con3, and the second inverter 312-6 is configured to receive the second differential edge signal INN_edge and invert and delay the second differential edge signal INN_edge to output as the second pre-emphasis control signal Con2.

The third buffer 312-3, the first inverter 312-4, the fourth buffer 312-5, and the second inverter 312-6 may have the same delay time.

Figure 7:
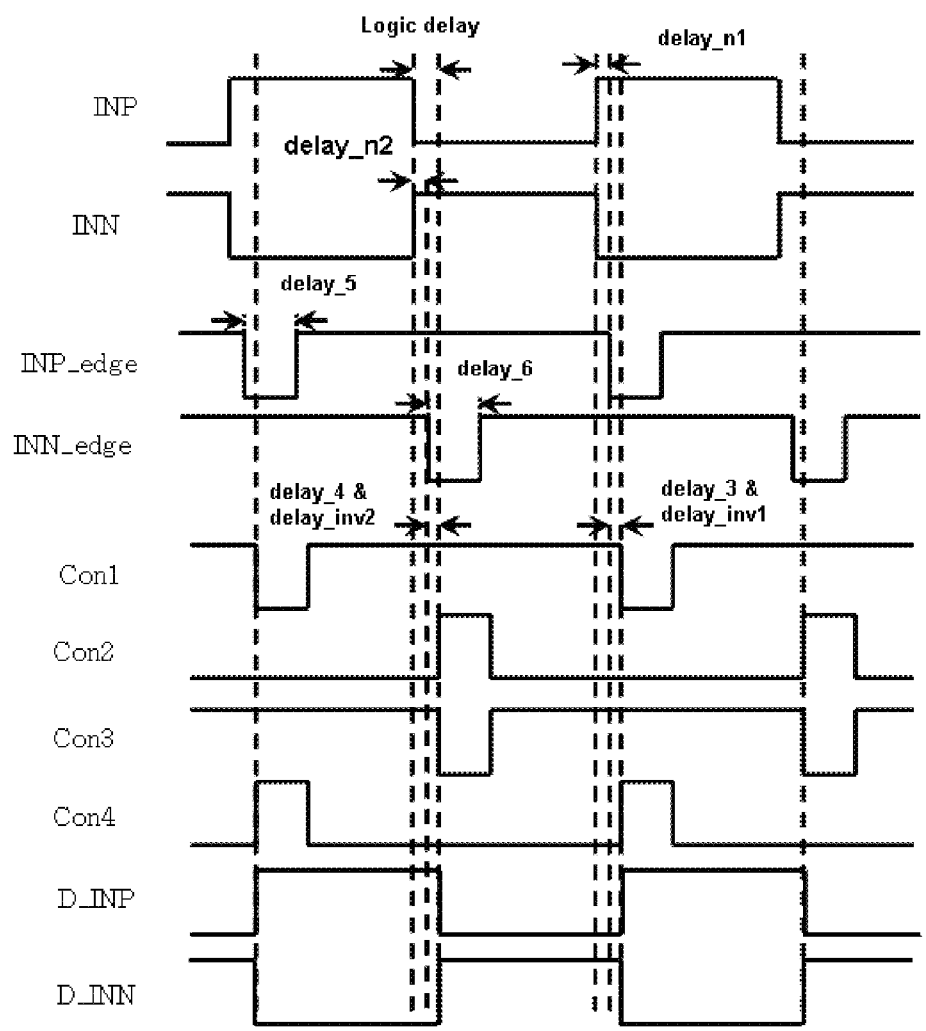
FIG. 7 is a timing diagram explaining the operation of the pre-emphasis circuit in the differential current signaling system according to the embodiment of the present invention.

FIG. 7 is a timing diagram explaining the operation of the pre-emphasis circuit in the differential current signaling system according to the embodiment of the present invention.

Referring to FIGS. 6 and 7, the pre-emphasis control signal generation unit 310 according to the embodiment of the present invention receives the differential input signals INP and INN and generates the delayed differential input signals D_INP and D_INN and the pre-emphasis control signals Con1 to Con4.

When the first and second differential input signals INP and INN are inputted, the delay circuit 311 of the pre-emphasis control signal generation unit 310 delays the first and second differential input signals INP and INN by a preset delay time, and transmits the delayed differential input signals D_INP and D_INN to the output driver 320.

Meanwhile, the pre-emphasis control signal generation unit 310 performs a NAND operation on the first differential input signal INP and a signal obtained by delaying the second differential input signal INN by a delay time delay_5 of the fifth buffer 312-1a, and generates the first differential edge signal INP_edge. Furthermore, the pre-emphasis control signal generation unit 310 performs a NAND operation on the second differential input signal INN and a signal obtained by delaying the first differential input signal INP by a delay time delay_6 of the sixth buffer 312-2a, and generates the second differential edge signal INN_edge. The first differential edge signal INP_edge changes to a logic low level at a time point where the first differential edge signal INP_edge is delayed by a delay time delay_n1 of the first NAND gate 312-1b from a rising edge of the first differential input signal INP, is maintained during the delay time delay_5 of the fifth buffer, and then changes to a logic high level. The second differential edge signal INN_edge changes to a logic low level at a time point where the second differential edge signal INN_edge is delayed by a delay time delay_n2 of the second NAND gate 312-2b from a rising edge of the second differential input signal INN, is delayed during the delay time delay_6 of the sixth buffer, and then changes to a logic high level.

The first pre-emphasis control signal Con1 is a signal obtained by delaying the first differential edge signal INP_edge through the third buffer 312-3, and the fourth pre-emphasis control signal Con4 is a signal obtained by inverting and delaying the first differential edge signal INP_edge through the first inverter 312-4.

The second pre-emphasis control signal Con2 is a signal obtained by delaying the second differential edge signal INN_edge through the fourth buffer 312-4, and the third pre-emphasis control signal Con3 is a signal obtained by inverting and delaying the second differential edge signal INN_edge through the second inverter 312-5.

The delayed differential input signals D_INP and D_INN are signals obtained by delaying the differential input signals INP and INN through the first and second buffers 311-1 and 311-2, respectively. In this embodiment, the differential input signals are delayed to supply an output driver input at a precise timing when the pre-emphasis control signal generation unit 310 generates the pre-emphasis control signals Con1 to Con4 and supplies the generated pre-emphasis control signals con1 to con4 to the output driver 320.

At this time, the first and second buffers 311-1 and 311-2 have the same delay time as a logic delay time which is required until the pre-emphasis control signal generation unit 310 receives the differential input signals INP and INN and generates the pre-emphasis control signals Con1 to Con4.

That is, the logic delay time is equal to the sum of the delay time delay_n1 of the first NAND gate 312-1b and the delay time delay_3 of the third buffer 312-3 or a delay time delay_inv1 of the first inverter 312-4. Furthermore, the logic delay time is equal to the sum of the delay time delay_n2 of the second NAND gate 312-2b and the delay time delay_4 of the fourth buffer 312-5 or a delay time delay_inv2 of the second inverter 312-6.

At this time, the delay time delay_inv1 of the first inverter 312-4 may be designed in the same manner as the delay time delay_3 of the third buffer 312-3, and the delay time delay_inv2 of the second inverter 312-6 may be designed in the same manner as the delay time delay_4 of the fourth buffer 312-5.

Meanwhile, when a rising edge of the first differential input signal INP and a falling edge of the second differential input signal INN are inputted, the control signal generation circuit 312 performs a logical operation on the inputted signals, generates the low-level first pre-emphasis control signal Con1 and the high-level fourth pre-emphasis control signal Con4, and transmits the generated signals to the pre-emphasis circuit 330 and 340. At this time, the first switch SW1 of the first pre-emphasis circuit 330 is turned on and operates as a source such that an output current based on the first voltage VDD is supplied to the first output node N1. The fourth switch SW4 of the second pre-emphasis circuit 340 is turned on and operates as a sink such that an output current from the second output node N2 is sunk to the ground.

When a falling edge of the first differential input signal INP and a rising edge of the second differential input signal INN are inputted, the control signal generation circuit 312 performs a logical operation on the received signals, generates the high-level second pre-emphasis control signal Con2 and the low-level third pre-emphasis control signal Con3, and transmits the generated signals to the pre-emphasis circuit 330 and 340.

At this time, the second switch SW2 of the first pre-emphasis circuit 330 is turned on and operates as a sink such that an output current from the first output node N1 is sunk to the ground.

Furthermore, the third switch SW3 of the second pre-emphasis circuit 340 is turned on and operates as a source such that an output current based on the first voltage VDD is supplied to the second output node N2.

As such, the first and second pre-emphasis circuits 330 and 340 controls a switch operating as a source and a switch operating as a sink according to the separate pre-emphasis control signals. Therefore, when one switch operates as a source or sink, a current does not flow into the other switch, which makes it possible to substantially prevent an unnecessary current flow.

Typically, the pre-emphasis circuit serves to reduce a rising time and a falling time of an output signal of the output driver, while supplying a current to an output node of the output driver.

At this time, the pre-emphasis effect may differ depending on the amount and time of pre-emphasis current. However, as the amount and time of pre-emphasis current increases, the pre-emphasis performance is not improved, and the pre-emphasis current needs to be actively supplied depending on the signal attenuation degree of the transmission line.

Figure 8:
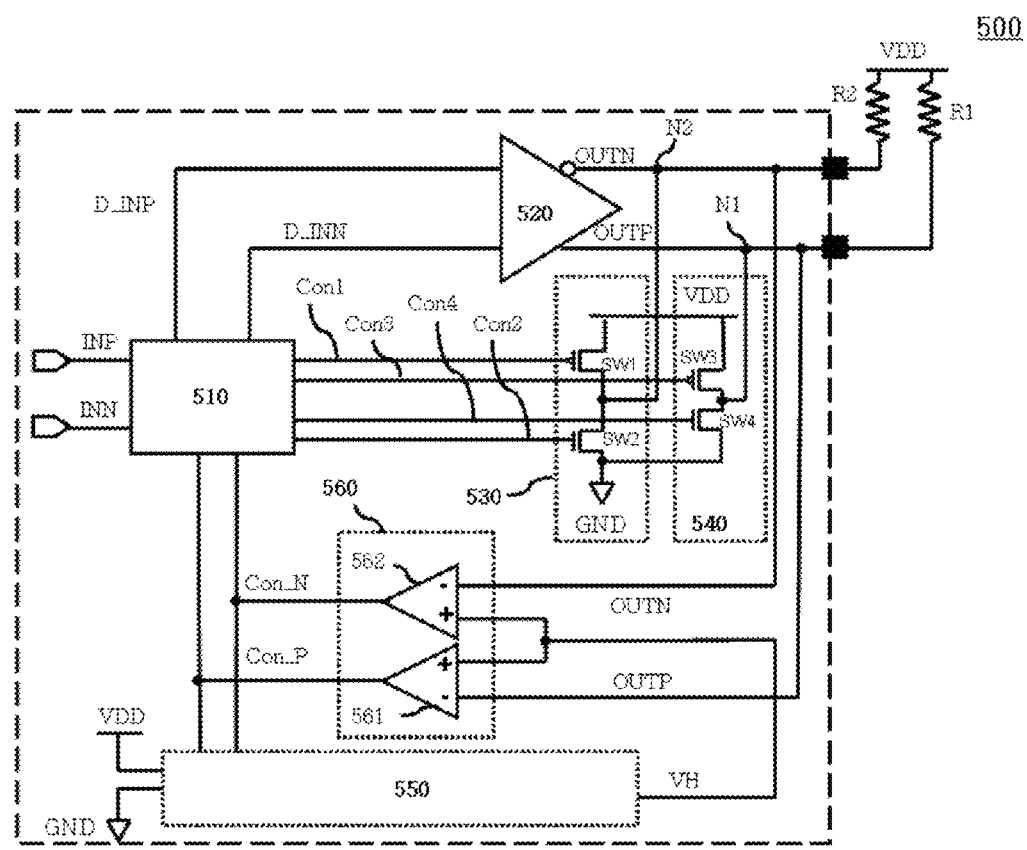
FIG. 8 illustrates the configuration of a differential current signaling system capable of actively supplying a pre-emphasis current according to another embodiment of the present invention.

FIG. 8 illustrates the configuration of a differential current signaling system capable of actively supplying a pre-emphasis current according to another embodiment of the present invention.

Referring to FIG. 8, the differential current signaling system 500 according to the embodiment of the present invention includes a pre-emphasis control signal generation unit 510, an output driver 520, a pre-emphasis circuit 530 and 540, a dummy unit 550, and a comparison unit 560.

The pre-emphasis control signal generation unit 510 is configured to receive differential input signals INP and INN and differential control signals Con_P and Con_N and generate delayed differential control signals D_INP and D_INN and pre-emphasis control signals Con1 to Con4.

The output driver 520 is configured to generate output signals OUTP and OUTN in response to the delayed differential input signals D_INP and D_INN, and output the output signals OUTP and OUTN to output nodes N1 and N2.

The pre-emphasis circuit 530 and 540 generates pre-emphasis output currents in response to the pre-emphasis control signals Con1 to Con4 generated by the pre-emphasis control signal generation unit 510, and outputs the generated pre-emphasis output currents to the output node N1 and N2. Since the pre-emphasis circuit 530 and 540 illustrated in FIG. 8 has the same configuration as the pre-emphasis circuit 330 and 340 illustrated in FIG. 3, the detailed descriptions thereof are omitted herein.

The dummy unit 550 is configured to receive the first voltage VDD and the second voltage GND, generate a low voltage VL and a high voltage VH, and output the high voltage VH. The high voltage VH is used as a reference voltage of the comparison unit 560.

The comparison unit 560 includes a first comparator 561 and a second comparator 562 and is configured to compare output signals OUTP and OUTN with the reference voltage outputted from the dummy unit 550, generate the differential control signals Con_P and Con_N, and transmit the generated differential control signals Con_P and Con_N to the pre-emphasis control signal generation unit 510 and the dummy unit 550.

The first comparator 561 has an inverting terminal configured to receive a first output signal OUTP and a non-inverting terminal configured to receive the reference voltage as the high voltage VH. At this time, when the reference voltage has a larger value than the first output signal OUTP, the first comparator 561 generates the high-level first differential control signal Con_P, and when the reference voltage has a smaller value than the first output signal OUTP, the first comparator 561 generates the low-level first differential control signal Con_P.

The second comparator 562 has an inverting terminal configured to receive a second output signal OUTN and a non-inverting terminal configured to receive the reference voltage as the high voltage VH. At this time, when the reference voltage has a larger value than the second output signal OUTN, the second comparator 562 generates the high-level second differential control signal Con_N, and when the reference voltage has a smaller value than the second output signal OUTN, the second comparator 562 generates the low-level second differential control signal Con_N.

Figure 9:
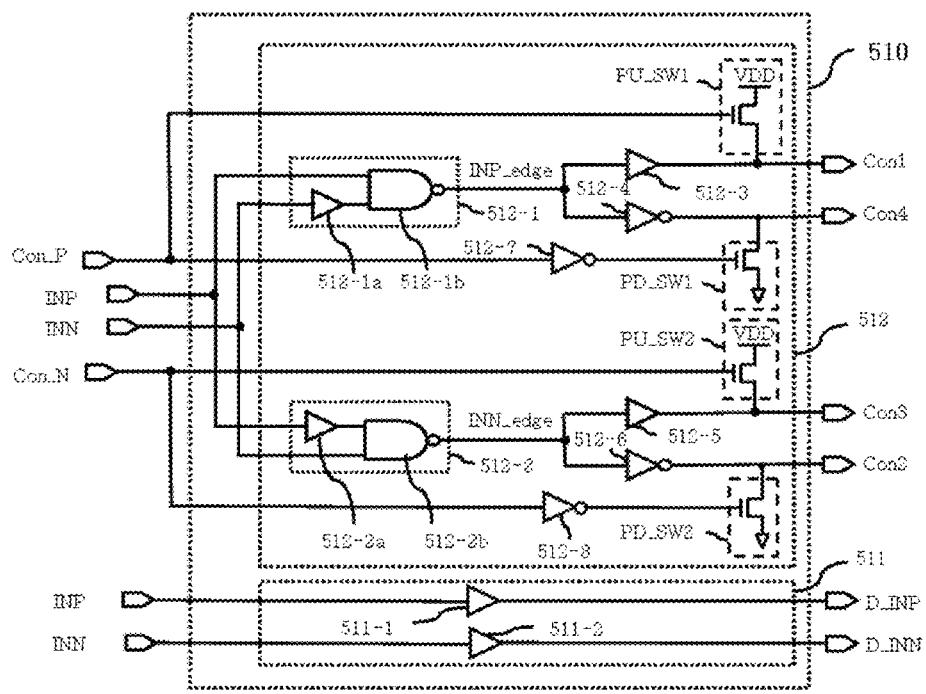
FIG. 9 illustrates the configuration of a pre-emphasis control signal generation unit of the differential current signaling system illustrated in FIG. 8.

FIG. 9 illustrates the configuration of the pre-emphasis control signal generation unit of the differential current signaling system illustrated in FIG. 8.

Referring to FIG. 9, the pre-emphasis control signal generation unit 510 according to the embodiment of the present invention includes a delay circuit 511 and a control signal generation circuit 512.

The delay circuit 511 includes a first buffer 511-1 and a second buffer 511-2. The first buffer 511-1 is configured to receive the first differential input signal INP and generate the delayed first input signal D_INP, and the second buffer 511-2 is configured to receive the second differential input signal INN and generate the delayed second differential input signal D_INN.

The control signal generation circuit 512 is configured to receive the differential input signals INP and INN and the differential control signals Con_P and Con_N and generate the pre-emphasis control signals Con1 to Con4, and includes a first logic circuit section 512-1, a second logic circuit section 512-2, a third buffer 512-3, a first inverter 512-4, a fourth buffer 512-5, a second inverter 512-6, a first pull-up switch PU_SW1, a first pull-down switch PD_SW1, a second pull-up switch PU_SW2, and a second pull-down switch PD_SW2.

The first logic circuit section 512-1 includes a fifth buffer 512-1a and a first NAND gate 512-1b. The fifth buffer 512-1a has a first terminal coupled to the second differential input signal INN. The first NAND gate 512-1b has a first input terminal configured to receive the first differential input signal INP and a second input terminal configured to receive an output signal of the fifth buffer 512-1a and is configured to perform a NAND operation on the received signals and output a first differential edge signal INP_edge. That is, the first logic circuit section 512-1 performs a logical operation on the first and second differential input signals INP and INN and generates the first differential edge signal INP_edge.

The second logic circuit section 512-2 includes a sixth buffer 512-2a and a second NAND gate 512-2b. The sixth buffer 512-2a has a first terminal coupled to the first differential input signal INP. The second NAND gate 312-2b has a first input terminal configured to receive the second differential input signal INN and a second input terminal configured to receive an output signal of the sixth buffer 512-2a and is configured to perform a NAND operation on the received signals and output a second differential edge signal INN_edge. That is, the second logic circuit section 512-2 performs a logical operation on the first and second differential input signals INP and INN and generates the second differential edge signal INN_edge.

The third buffer 512-3 is configured to receive the first differential edge signal INP_edge and delay the received first differential edge signal INP_edge to output as the first pre-emphasis control signal Con1. The first inverter 512-4 is configured to receive the first differential edge signal INP_edge and invert the received first differential edge signal INP_edge to output as the fourth pre-emphasis control signal Con4. The fourth buffer 512-5 is configured to receive the second differential edge signal INN_edge and delay the second differential edge signal INN_edge to output as the third pre-emphasis control signal Con3. The second inverter 512-6 is configured to receive the second differential edge signal INN_edge and invert the received second differential edge signal INN_edge to output as the second pre-emphasis control signal Con2.

The first pull-up switch PU_SW1 has a first terminal coupled to the first voltage VDD, a second terminal coupled to an output terminal of the third buffer 512-3, and a control terminal configured to receive the first differential control signal Con_P. The first pull-down switch PD_SW1 has a first terminal coupled to an output terminal of the first inverter 512-4, a second terminal coupled to the second voltage GND, and a control terminal configured to receive the inverted first differential control signal Con_P. The third inverter 512-7 is configured to invert the first differential control signal Con_P and output the inverted first differential control signal Con_P.

The second pull-up switch PU_SW2 has a first terminal coupled to the first voltage VDD, a second terminal coupled to an output terminal of the fourth buffer 512-5, and a control terminal configured to receive the second differential control signal Con_N. The second pull-down switch PD_SW2 has a first terminal coupled to an output terminal of the second inverter 512-6, a second terminal coupled to the second voltage GND, and a control terminal configured to receive the inverted second differential control signal Con_N. The fourth inverter 512-8 is configured to invert the second differential control signal Con_N and output the inverted second differential control signal Con_N.

The pre-emphasis control signal generation unit 510 receives the differential control signals Con_P and Con_N generated by the comparison unit 560 and operates the first pull-up switch PU_SW1, the first pull-down switch PD_SW2, the second pull-up switch PU_SW2, and the second pull-down switch PD_SW2 to actively change the pulse widths of the pre-emphasis control signals Con1 to Con4.

The pre-emphasis control signals Con1 to Con4 are used as inputs of the first to fourth switches SW1 to SW4 of the pre-emphasis circuit 530 and 540 to supply the pre-emphasis output currents to the output signals OUTP and OUTN of the output driver 520 such that the output signals OUTP and OUTN operate while maintaining a constant swing in the range between the high voltage VH and the low voltage VL.

Figure 10:
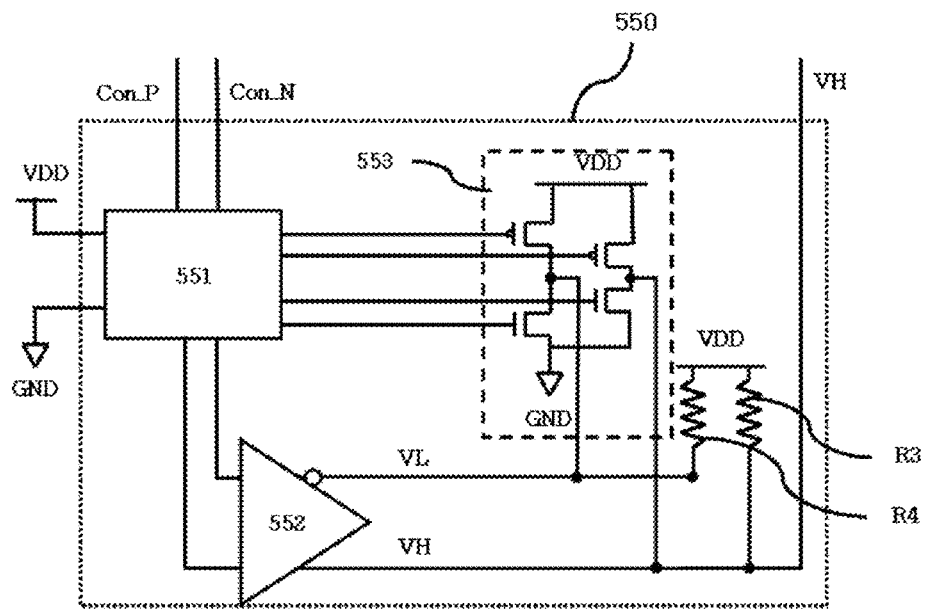
FIG. 10 illustrates the configuration of a dummy unit of the differential current signaling system of FIG. 8.

FIG. 10 illustrates the configuration of the dummy unit of the differential current signaling system of FIG. 8.

The dummy unit 550 serves to generate a DC voltage level such that the output signals OUTP and OUTN of the output driver 520 have a constant swing, and includes a dummy pre-emphasis control signal generation block 551, a dummy output driver 552, a dummy pre-emphasis circuit 553, and termination resistors R3 and R4 coupled to an output terminal of the dummy output driver 552. The dummy unit 550 may be configured with the same circuit as the pre-emphasis control signal generation unit 510, the output driver 520, the first pre-emphasis circuit 530, and the second pre-emphasis circuit 540, which actually perform a pre-emphasis operation.

The dummy pre-emphasis control signal generation block 551 is configured to receive the first voltage VDD indicating a logic high level and the second voltage GND indicating a logic low level and generate the high voltage VH and the low voltage VL having a constant voltage difference in response to the differential control signals Con_N and Con_P. The high voltage VH generated by the dummy unit 550 may be used as a reference voltage which is compared with the output signals OUTN and OUTP of the output driver 520 by the comparison unit 560.

Figure 11:
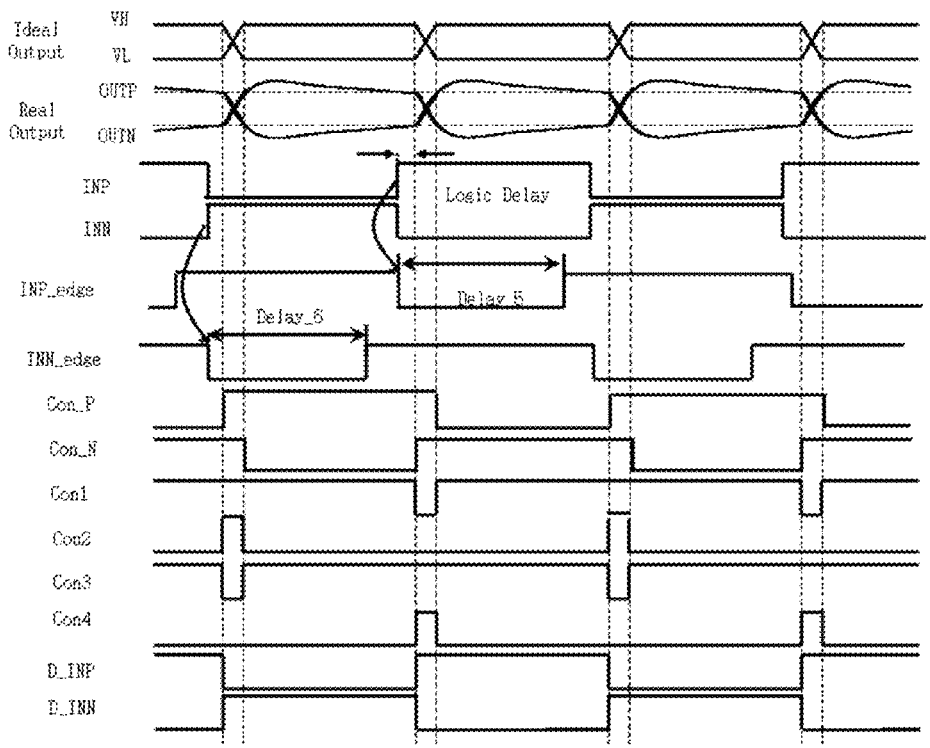
FIG. 11 is a timing diagram showing the operation of a pre-emphasis circuit of the differential current signaling system illustrated in FIG. 8.

FIG. 11 is a timing diagram showing the operation of the pre-emphasis circuit of the differential current signaling system illustrated in FIG. 8.

Referring to FIGS. 8 to 11, the operation of the differential current signaling system capable of actively supplying a pre-emphasis current according to the embodiment of the present invention will be described as follows.

Referring to FIG. 11, an ideal output of the output driver 520 in the differential current signaling system has a constant swing between the high voltage VH and the low voltage VL. However, a real output exceeds the range between the high voltage VH and the low voltage VL corresponding to the ideal DC level, due to an excessive supply of the pre-emphasis current. The supply of the excessive pre-emphasis current may have a bad effect upon data transmission.

The pre-emphasis control signal generation unit 510 performs a NAND operation on the first differential input signal INP and a signal obtained by delaying the second differential input signal INN by a delay time delay_5 of the fifth buffer 512-1a, and generates the first differential edge signal INP_edge. Furthermore, the pre-emphasis control signal generation unit 510 performs a NAND operation on the second differential input signal INN and a signal obtained by delaying the first differential input signal INP by a delay time delay_6 of the sixth buffer 512-2a, and generates the second differential edge signal INN_edge.

The first differential edge signal INP_edge changes to a logic low level at a rising edge of the first differential input signal INP, is maintained during the delay time delay_5 of the fifth buffer 512-1a, and changes to a logic high level. The second differential edge signal INN_edge changes to a logic low level at a rising edge of the second differential input signal INN, is maintained during the delay time delay_6 of the sixth buffer 512-2a, and changes to a logic high level. The delay time delay_5 of the fifth buffer 512-1a and the delay time delay_6 of the sixth buffer 512-2a indicate a maximum time during which the pre-emphasis current may be supplied. The delay times delay_5 and delay_6 have the same value and may be designed to be smaller than a one-bit data time (bps).

The delayed differential input signals D_INP and D_INN are signals obtained by delaying the differential input signals INP and INN through the first and second buffers 511-1 and 511-2, respectively. In this embodiment, the differential input signals are delayed in order to supply an output driver input at a precise timing, when the pre-emphasis control signal generation unit 510 generates the pre-emphasis control signals Con1 to Con4 and supplies the generated pre-emphasis control signals Con1 to Con4 to the output driver 520.

At this time, the delay time of the first and second buffers 511-1 and 511-2 has the same value as a logic delay time that is required from when the differential input signals INP and INN are inputted to the pre-emphasis control signal generation unit 510 to when the pre-emphasis control signals Con1 to Con4 are generated. That is, the logic delay time may correspond to the sum of the delay time of the first and second buffers 511-1 and 511-2 and a delay time depending on other logic gates 512-1b and 512-2b and interconnections.

In the differential current signaling system according to the embodiment of the present invention, the output driver 520 may have a buffer structure of a current mode logic (CML) which is formed in such a manner that off-chip resistors R1 and R2 are coupled to the first voltage VDD. Accordingly, the dummy unit 550 includes dummy resistors R3 and R4 as on-chip resistors coupled to the first voltage VDD.

When the output driver 520 includes low-voltage positive/pseudo emitter coupled logic (LVPECL), voltage mode logic (VML), or low-voltage differential signaling (LVDS), off-chip resistors R1 and R2 and dummy resistors R3 and R4 suitable for the structure of the output driver 520 may be applied.

Figure 12:
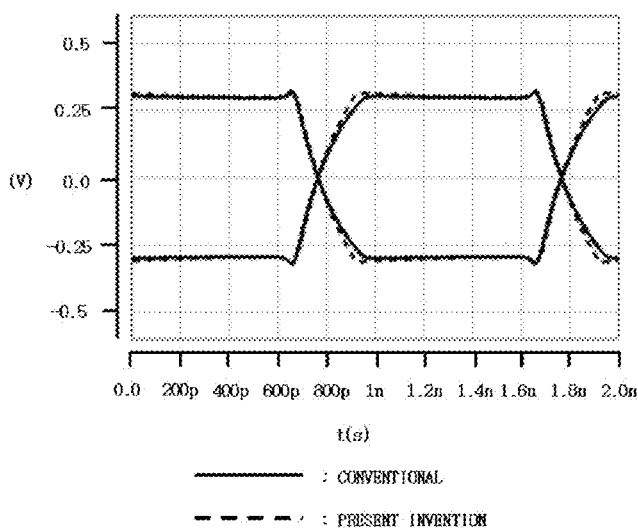
FIG. 12 is a diagram showing the waveform of an output signal when a load value of a transmission line in the differential current signaling system illustrated in FIG. 8 is equal to a design value.

FIG. 12 is a diagram showing the waveform of an output signal when a load value of the transmission line in the differential current signaling system illustrated in FIG. 8 is equal to a design value.

Referring to FIG. 12, when the load value of the transmission line is equal to a load value expected during design, the output signals OUTP and OUTN of the conventional pre-emphasis circuit and the pre-emphasis circuit according to the embodiment of the present invention operate in the range between the high voltage VH and the low voltage VL.

Figure 13:
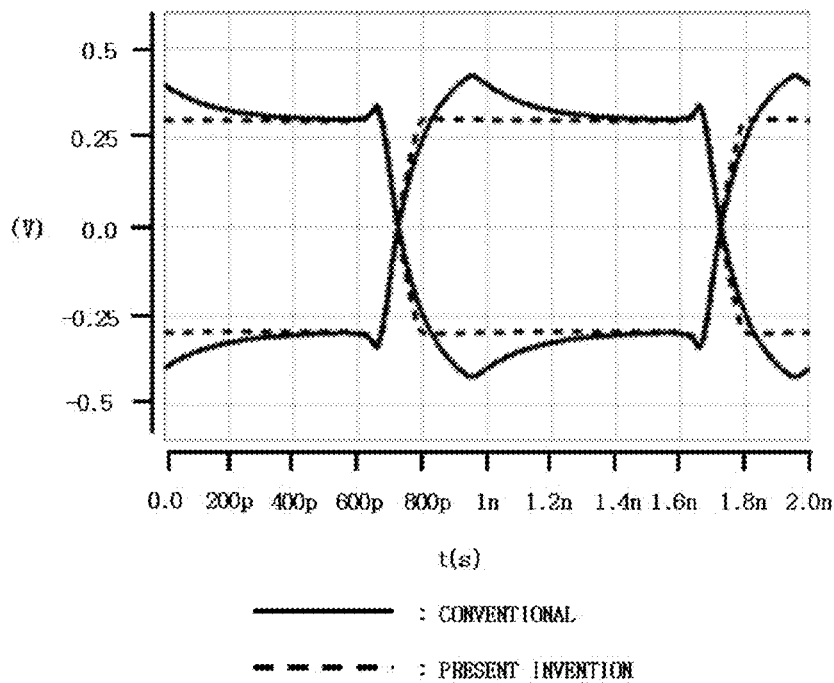
FIG. 13 is a diagram showing the waveform of an output signal when the load value of the transmission line in the differential current signaling system illustrated in FIG. 8 is smaller than the design value.

FIG. 13 is a diagram showing the waveform of an output signal when a load value of the transmission line in the differential current signaling system illustrated in FIG. 8 is smaller than the design value.

Referring to FIG. 13, when the load value of the transmission line is smaller than the load value expected during design, the conventional pre-emphasis circuit continuously supplies a pre-emphasis current even though the output signals OUTP and OUTN approached the high voltage VH and the low voltage VL. Thus, the output signals OUTP and OUTN have a large value than the high voltage VH or a smaller value than the low voltage VL.

However, the pre-emphasis circuit according to the embodiment of the present invention feeds the output signals OUTP and OUTN back to the comparison unit 560 to control the supply time of the pre-emphasis current. Thus, the output signals OUTP and OUTN always operate in the range between the high voltage VH and the low voltage VL.

Figure 14:
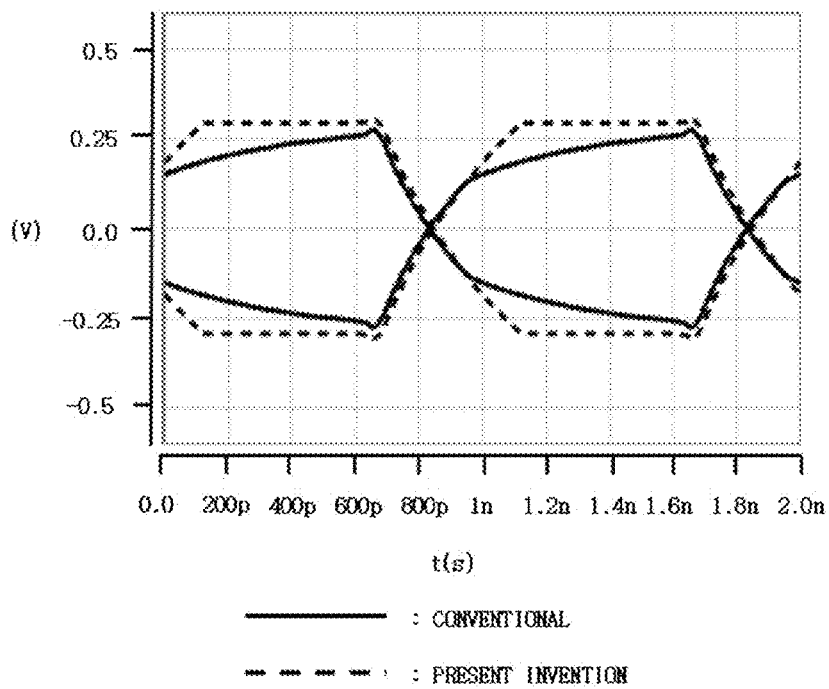
FIG. 14 is a diagram showing the waveform of an output signal when the load value of the transmission line in the differential current signaling system illustrated in FIG. 8 is larger than the design value.

FIG. 14 is a diagram showing the waveform of an output signal when the load value of the transmission line in the differential current signaling system illustrated in FIG. 8 is larger than the design value.

Referring to FIG. 14, when the load value of the transmission line is larger than the load value expected during design, the conventional pre-emphasis circuit supplies a pre-emphasis current according to a preset data value. However, since the load value is larger than the design value, the conventional pre-emphasis circuit stops supplying the pre-emphasis current before the output signals OUTP and OUTN approach the high voltage VH.

However, the pre-emphasis circuit according to the embodiment of the present invention continuously supplies the pre-emphasis current before the output signals OUTP and OUTN approach the high voltage VH. Therefore, although the rising time or falling time slightly increases, the output signals OUTP and OUTN approach the high voltage VH and the low voltage VL.

According to the embodiments of the present invention, the number of switching transistors required for the operation of the circuit may be decreased to reduce parasitic resistance and parasitic capacitance based on the transistors, which makes it possible to improve the switching speed.

Furthermore, as the respective switching transistors are controlled by the separate pre-emphasis control signals, an undesired current may be substantially prevented, and a pre-emphasis output current may be actively controlled and supplied to further improve the pre-emphasis performance.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A pre-emphasis circuit which transmits a pre-emphasis output current to an output node of an output driver in response to first to fourth pre-emphasis control signals generated by a logical operation on differential input signals, the pre-emphasis circuit comprising:
   a first pre-emphasis circuit driven in a range between a first voltage and a second voltage and configured to generate a first pre-emphasis output current in response to the first and second pre-emphasis control signals and output the generated first pre-emphasis output current to a first output node of the output driver; and
   a second pre-emphasis circuit driven in the range between the first voltage and the second voltage and configured to generate a second pre-emphasis output current in response to the third and fourth pre-emphasis control signals and output the generated second pre-emphasis output current to a second output node of the output driver,
   wherein a pre-emphasis control signal generation unit is configured to generate the first to fourth pre-emphasis control signals by performing the logical operation on the differential input signals,
   wherein the first pre-emphasis circuit comprises:
      a first switch having a first terminal coupled to the first voltage, a second terminal coupled to the first output node, and a control terminal configured to receive the first pre-emphasis control signal; and
      a second switch having a first terminal coupled to the first output node, a second terminal coupled to the second voltage, and a control terminal configured to receive the second pre-emphasis control signal, and
   wherein the second pre-emphasis circuit comprises:
      a third switch having a first terminal coupled to the first voltage, a second terminal coupled to the second output node, and a control terminal configured to receive the third pre-emphasis control signal; and
      a fourth switch having a first terminal coupled to the second output node, a second terminal coupled to the second voltage, and a control terminal configured to receive the fourth pre-emphasis control signal.

2. The pre-emphasis circuit of claim 1, wherein when the first and fourth switches are turned on in response to the first to fourth pre-emphasis control signals, the second and third switches are turned off, and when the first and fourth switches are turned off, the second and third switches are turned on.

3. The pre-emphasis circuit of claim 1, further comprising:
   a first current source formed between the first terminal of the first switch and the first voltage;
   a second current source formed between the second terminal of the second switch and the second voltage;
   a third current source formed between the first terminal of the third switch and the first voltage; and
   a fourth current source formed between the second terminal of the fourth switch and the second voltage.

4. A differential current signaling system comprising:
   a pre-emphasis control signal generation unit configured to receive differential input signals and generate delayed differential input signals and pre-emphasis control signals;
   an output driver configured to generate output signals in response to the delayed differential input signals and output the generated output signals to output nodes; and
   a pre-emphasis circuit configured to generate a pre-emphasis output current in response to the pre-emphasis control signals and output the generated pre-emphasis output current to the output nodes.

5. The differential current signaling system of claim 4, wherein the pre-emphasis control signal generation unit comprises:
   a delay circuit configured to delay the differential input signals and generate the delayed differential input signals; and
   a control signal generation circuit configured to perform a logical operation on the differential input signals and generate the pre-emphasis control signals.

6. The differential current signaling system of claim 5, wherein the control signal generation circuit comprises:
   a first logic circuit comprising a fifth buffer having a first terminal coupled to a second differential input signal and a first NAND gate having a first input terminal configured to receive a first differential input signal and a second input terminal configured to receive an output signal of the fifth buffer and configured to perform a NAND operation on the received signals and output a first differential edge signal;
   a second logic circuit comprising a sixth buffer having a first terminal coupled to the first differential input signal and a second NAND gate having a first input terminal configured to receive an output signal of the sixth buffer and a second input terminal configured to receive the second differential input signal and configured to perform a NAND operation on the received signals and output a second differential edge signal;

a third buffer configured to receive the first differential edge signal and delay the received first differential edge signal to output as a first pre-emphasis control signal;

a first inverter configured to receive the first differential edge signal and invert the received first differential edge signal to output as a fourth pre-emphasis control signal;

a fourth buffer configured to receive the second differential edge signal and delay the received second differential edge signal to output as the third pre-emphasis control signal; and a second inverter configured to receive the second differential edge signal and invert the received second differential edge signal to output as the second pre-emphasis control signal.

7. The differential current signaling system of claim 4, wherein the pre-emphasis circuit comprises:

a first pre-emphasis circuit comprising a first switch having a first terminal coupled to a first voltage, a second terminal coupled to a first output node of the output driver, and a control terminal configured to receive the first pre-emphasis control signal and a second switch having a first terminal coupled to the first output node, a second terminal coupled to a second voltage, and a control terminal configured to receive the second pre-emphasis control signal; and the second pre-emphasis circuit comprising a third switch having a first terminal coupled to the first voltage, a second terminal coupled to a second output node of the output driver, and a control terminal configured to receive the third pre-emphasis control signal and a fourth switch having a first terminal coupled to the second output node, a second terminal coupled to the second voltage, and a control terminal configured to receive the fourth pre-emphasis control signal.

8. A differential current signaling system comprising:

a pre-emphasis control signal generation unit configured to receive differential input signals and differential control signals and generate delayed differential input signals and pre-emphasis control signals;

an output driver configured to generate output signals in response to the delayed differential input signals and output the generated output signals to an output node;

a pre-emphasis circuit configured to generate a pre-emphasis output current in response to the pre-emphasis control signals and output the generated pre-emphasis output current to the output node;

a dummy unit configured to generate and output a reference voltage which is a high voltage; and a comparison unit configured to compare the output signals with the reference voltage, generate the differential control signals, and provide the generated differential control signals to the pre-emphasis control signal generation unit.

9. The differential current signaling system of claim 8, wherein the pre-emphasis control signal generation unit comprises a control signal generation circuit configured to perform a logical operation on the differential input signals to generate the pre-emphasis control signals, and receive the differential control signals to change a pulse width of the pre-emphasis control signals.

10. The differential current signaling system of claim 9, wherein the control signal generation circuit comprises:

a first pull-up switch configured to receive a first differential control signal through a control terminal thereof and pull-up drive a first pre-emphasis control signal;

a first pull-down switch configured to receive the inverted first differential control signal through a control terminal thereof and pull-down drive a second pre-emphasis control signal;

a second pull-up switch configured to receive a second differential control signal through a control terminal thereof and pull-up drive a third pre-emphasis control signal; and a second pull-down switch configured to receive the inverted second differential control signal through a control terminal thereof and pull-down drive a fourth pre-emphasis control signal.

11. The differential current signaling system of claim 8, wherein the comparison unit comprises:

a first comparator configured to compare a first output signal with the reference voltage and output a first differential control signal; and a second comparator configured to compare a second output signal with the reference voltage and output a second differential control signal.

\* \* \* \* \*